US012238663B2

(12) United States Patent
Bessho et al.

(10) Patent No.: US 12,238,663 B2
(45) Date of Patent: Feb. 25, 2025

(54) WIRELESS COMMUNICATION SYSTEM, WIRELESS COMMUNICATION METHOD, CONTROL DEVICE, AND CONTROL METHOD

(71) Applicants: TOKYO ELECTRON LIMITED, Tokyo (JP); Aval Data Corporation, Tokyo (JP)

(72) Inventors: Tomoya Bessho, Yamanashi (JP); Akihito Mitsumine, Tokyo (JP)

(73) Assignees: Tokyo Electron Limited, Tokyo (JP); Aval Data Corporation, Tokyo (JP)

( * ) Notice: Subject to any disclaimer, the term of this patent is extended or adjusted under 35 U.S.C. 154(b) by 42 days.

(21) Appl. No.: 18/354,509

(22) Filed: Jul. 18, 2023

(65) Prior Publication Data

US 2024/0031959 A1 Jan. 25, 2024

(30) Foreign Application Priority Data

Jul. 21, 2022 (JP) .................................. 2022-116541

(51) Int. Cl.
*H04W 56/00* (2009.01)
*C23C 16/455* (2006.01)
(Continued)

(52) U.S. Cl.
CPC ... *H04W 56/0015* (2013.01); *C23C 16/45525* (2013.01); *C23C 16/52* (2013.01);
(Continued)

(58) Field of Classification Search
CPC ........... H04W 56/0015; H04W 56/001; H04W 56/005; H04W 56/0065; H04W 76/10;
(Continued)

(56) References Cited

U.S. PATENT DOCUMENTS 10,111,196 B2 * 10/2018 Gao .................. H04W 56/00
11,115,941 B2 9/2021 Teruhi et al.
(Continued)

FOREIGN PATENT DOCUMENTS

WO WO 2017/200043 A1 11/2017

OTHER PUBLICATIONS

Mirabella et al., Dynamic Continuous clock Synchronization for IEEE 802.15.4 based Sensor Networks, 2008, IEEE, pp. 3438-2444. (Year: 2008).*

*Primary Examiner* — John J Tabone, Jr.
(74) *Attorney, Agent, or Firm* — Fenwick & West LLP (57) ABSTRACT

There is provided a wireless communication system for transmitting periodic data from a first device to a plurality of second devices by wireless communication comprising: a first wireless device connected to the first device; and a plurality of second wireless devices connected to the plurality of second devices, respectively, wherein the first wireless device includes a first wireless portion and a first control portion, the second wireless device includes a second wireless portion and a second control portion, and the first control portion and the second control portion synchronize the first wireless device and the plurality of second wireless devices when a time until the first wireless device receives a response from the second wireless device after the first wireless device has transmitted the periodic data from the first device is equal to or less than a set value.

24 Claims, 9 Drawing Sheets

(51) Int. Cl.
*C23C 16/52* (2006.01)
*H04W 76/10* (2018.01)
*H04W 84/12* (2009.01)

(52) U.S. Cl.
CPC ....... *H04W 56/001* (2013.01); *H04W 56/005* (2013.01); *H04W 56/0065* (2013.01); *H04W 76/10* (2018.02); *H04W 84/12* (2013.01)

(58) Field of Classification Search
CPC ... H04W 84/12; C23C 16/45525; C23C 16/52
USPC ............ 370/350, 324; 375/145, 240.28, 293, 375/354–357; 398/154; 455/502; 714/712, 821
See application file for complete search history.

(56) References Cited

U.S. PATENT DOCUMENTS

| | | | |
|---|---|---|---|
| 11,310,026 B2 * | 4/2022 | Arakawa | H04J 3/0638 |
| 11,360,918 B1 * | 6/2022 | Wroblewski | G06F 1/12 |
| 2009/0122782 A1 * | 5/2009 | Horn | H04W 56/001 |
| | | | 370/350 |
| 2011/0255528 A1 * | 10/2011 | Zakrzewski | H04W 56/009 |
| | | | 370/350 |
| 2019/0150106 A1 | 5/2019 | Teruhi et al. | |
| 2021/0243713 A1 * | 8/2021 | Ellenbeck | H04W 56/002 |
| 2022/0085968 A1 * | 3/2022 | Arakawa | H04J 3/0697 |
| 2024/0031959 A1 * | 1/2024 | Bessho | H04W 56/005 |

\* cited by examiner

WIRELESS COMMUNICATION SYSTEM, WIRELESS COMMUNICATION METHOD, CONTROL DEVICE, AND CONTROL METHOD

CROSS-REFERENCE TO RELATED APPLICATION

This application claims priority to Japanese Patent Application No. 2022-116541, filed on Jul. 21, 2022, which is incorporated by reference in its entirety.

TECHNICAL FIELD

The present disclosure relates to a wireless communication system, a wireless communication method, a control device, and a control method.

BACKGROUND

International Publication No. 2017/200043 discloses a time-synchronous wireless communication system including a first wireless device and a second wireless device. A wireless portion of the first wireless device individually wirelessly transmits timing information and continuation information regarding a transmission time which is a time when the timing information is transmitted as a time obtained from a first clock. The wireless portion of the second wireless device individually receives the timing information and the time information which are wirelessly transmitted. The second wireless device has a correction portion that corrects a second block based on a reference time which is a time indicated by the second clock when the wireless portion receives the timing information, and the transmission time obtained from the time information.

Technology of International Publication No. 2017/200043 suppresses occurrence of uncertainty at a time related to communication due to autonomous transmission waiting or automatic retransmission control which frequently occurs in a wireless standard for communication such as wireless LAN.

However, when transmitting periodic data from a first device to a plurality of second devices by wireless communication, there is a case where transmitting data synchronized with the plurality of second devices is requested. However, the technology of International Publication No. 2017/200043 suppresses the occurrence of the uncertainty at the time related to the communication, and it is not considered that the data is synchronized and transmitted with respect to a plurality of devices.

SUMMARY

The present disclosure provides a technology that synchronizing a first device and a plurality of second device when performing wireless communication from the first device to the plurality of second device.

In accordance with an aspect of the present disclosure, there is provided a wireless communication system for transmitting periodic data from a first device to a plurality of second devices by wireless communication comprising: a first wireless device connected to the first device; and a plurality of second wireless devices connected to the plurality of second devices, respectively, wherein the first wireless device includes a first wireless portion performing the wireless communication and a first control portion controlling the first wireless portion, the second wireless device includes a second wireless portion performing the wireless communication and a second control portion controlling the second wireless portion, and the first control portion and the second control portion synchronize the first wireless device and the plurality of second wireless devices when a time until the first wireless device receives a response from the second wireless device after the first wireless device has transmitted the periodic data from the first device is equal to or less than a set value.

DETAILED DESCRIPTION

Hereinafter, an embodiment will be described with reference to the accompanying drawings.

<Wireless Communication System>

Figure 1:
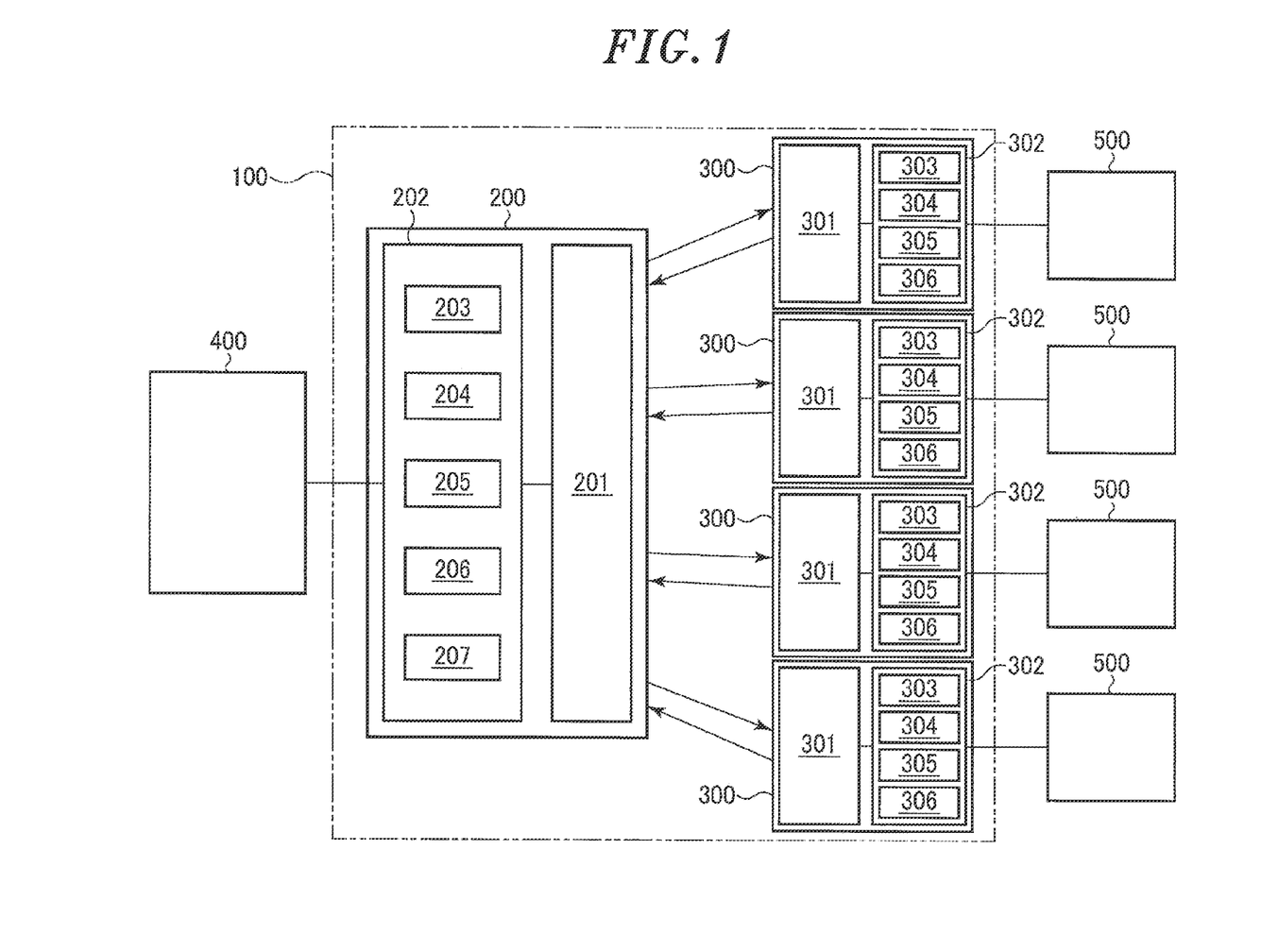
FIG. 1 is a block diagram illustrating a wireless communication system according to an embodiment.

FIG. 1 is a block diagram illustrating a wireless communication system according to an embodiment.

A wireless communication system 100 of the embodiment transmits periodic data from a first device 400 to a plurality of second devices 500 by wireless communication. In an illustrated example, four second devices 500 are illustrated, but if the number of second devices 500 is plural, even any number may be used.

In the embodiment, a targeted wireless communication standard is not particularly limited if periodic communication is unstable as described below, and communication standards of 2.4 GHz and 5 GHz bands, such as Wi-Fi, Zigbee, Bluetooth, BLE, etc., may be used as main standards.

The wireless communication system 100 has a first wireless device 200 connected to the first device 400 and a plurality of second wireless devices 300 connected to the plurality of second devices 500, respectively. The first device 400 and the second device 500 are, for example, control devices that control a control target, and it is illustrated that a control signal as periodic data is transmitted from the first device 400 which is a higher level control device to the plurality of second devices 500 which are lower level control devices, and a control target connected to the second device 500 is controlled.

The first wireless device 200 is, for example, an access point AP, and has a first wireless portion 201 (e.g., a circuit) that performs wireless communication by converting data into radio waves and a first control portion 202 controlling the wireless communication of the first wireless portion 201. Further, the second wireless device 300 is, for example, a client CL, and has a second wireless portion 301 that performs the wireless communication by converting data into radio waves and a second control portion 302 (e.g., a circuit) that controls the second wireless portion 301. Actual wireless communication is performed between the first wireless portion 201 and the second wireless portion 301.

The first control portion 202 and the second control portion 302 synchronize the first wireless device 200 and the second wireless device 300 when a time until the first wireless device 200 receives a response from the second wireless device 300 after the first wireless device 200 transmits the periodic data is equal to or less than a set value.

That is, the first control portion 202 creates data acquired by including a timer value to the periodic data from the first device 400, and measures a response time until the first wireless device 200 receives the response from the second wireless device 300 after the first wireless device 200 has transmitted the data. Then, the first control portion 202 determines whether the response time is equal to or less than the set value, and transmits a flag jointly with the data when the response time is equal to or less than the set value.

Meanwhile, the second control portion 302 writes a difference between a first timer value of the first wireless device 200 and a second timer value of the second wireless device 300 when the second wireless device 300 receives the periodic data transmitted from the first wireless device 200. In addition, when the second wireless device 300 receives the data jointly with the flag in which the response time is equal to or less than the set value from the first wireless device 200, the second control portion 302 rewrites the second timer value based on the difference, and establishes a synchronization relationship of the first wireless device 200 and the plurality of second wireless devices 300.

Even though the wireless communication system 100 is a multicast that transmits the data simultaneously to the plurality of second wireless devices 300 from the first wireless device 200, the wireless communication system 100 may be a unicast that transmits the data sequentially one by one to the plurality of second wireless devices 300 from the first wireless device 200.

Hereinafter, the above contents will be described in detail.

The first control portion 202 includes a first timer 203, a transmission data generation portion 204 (e.g., a circuit), a reception data monitor portion 205 (e.g., a circuit), a reception data determination portion 206 (e.g., a circuit), and a flag generation portion 207 (e.g., a circuit).

The first timer 203 measures the time in the first wireless device 200. The transmission data generation portion 204 generates data acquired by including the first timer value of the first timer 203 to the periodic data from the first device 400. The reception data monitor portion 205 monitors the response time until receiving the response from the second wireless device 300 after transmitting the data from the first wireless device 200. The reception data determination portion 206 determines whether the response time monitored by the reception data monitor portion 205 is equal to or less than a set value. The flag generation portion 207 generates flag 1 which is OK when the response time is equal to or less than the set value and sets flag 0 (does not generate the flag) as NG when the response time is more than the set value).

Further, the set value is appropriately set so as to guarantee the synchronization between the first wireless device 200 and the plurality of second wireless devices 300. As the set value, for example, a value (e.g., a shortest time +2%) acquired by adding a given margin to a shortest time decided based on a design value or an actual value may be used. Further, the set value may be obtained by statistical processing based on the actual value. For example, the set value may be a mean value or a center value obtained by the statistical processing for the actual value.

The transmission data generation portion 204 generates data acquired by including information of flag 1 to data of a next period when flag 1 is generated, and generates data of flag 0 as the data of the next period in the case of flag 0.

Each second control portion 302 includes a second timer 303, a timer value writing portion 304, a flag determination portion 305, and a timer value rewriting portion 306.

The second timer 303 measures the time in the second wireless device 300. When the second wireless device 300 receives the data transmitted from the first wireless device 200, the timer value writing portion 304 writes a difference between the second timer value of the second timer 303 and the first timer value of the received data. The flag determination portion 305 determines flag information of the received data. In the case of receiving data attached with flag 1, the timer value rewriting portion 306 rewrites the second timer value with a value acquired by subtracting a difference written on the timer value writing portion 304 before writing the data attached with flag 1 on the timer value writing portion 304 from the second timer value at the reception time. In this case, a difference of 0 is written on the timer value writing portion 304.

In other words, when flag 1 is attached to the received data, the data received previously represents that the first wireless device 200 receives the response within a set time, and the data is reliable data. As a result, at the previous time, the value of the difference written on the timer value writing portion 304 is also a reliable value. Therefore, as described above, the timer value rewriting portion 306 rewrites the second timer value of the second timer 303 to synchronize the first wireless device 200 and the plurality of second wireless devices 300. As such, the plurality of second wireless devices 300 may also be synchronized with each other by synchronizing the first wireless device 200 and the plurality of second wireless devices 300.

Further, in the case of receiving the data of flag 0, the difference is written on the timer value writing portion 304 by the calculation, but the written difference is discarded after a difference of the data of the next period is written.

Next, a wireless communication operation in the wireless communication system 100 configured as such will be described in detail.

Since a signal cable used for wired communication is not required in the wireless communication, minimization of the device may be achieved as compared with the wired communication, and environmental contribution is made by reduction of a wire. However, in the wireless communication, in the case of receiving the periodic data, specifically, in the case of transmitting data (packet) having a predetermined size at a predetermined period, a difference in communication time occurs by surrounding disturbance or deterioration of a communication environment. Such a problem does not generally occur in the wired communication.

Figure 2:
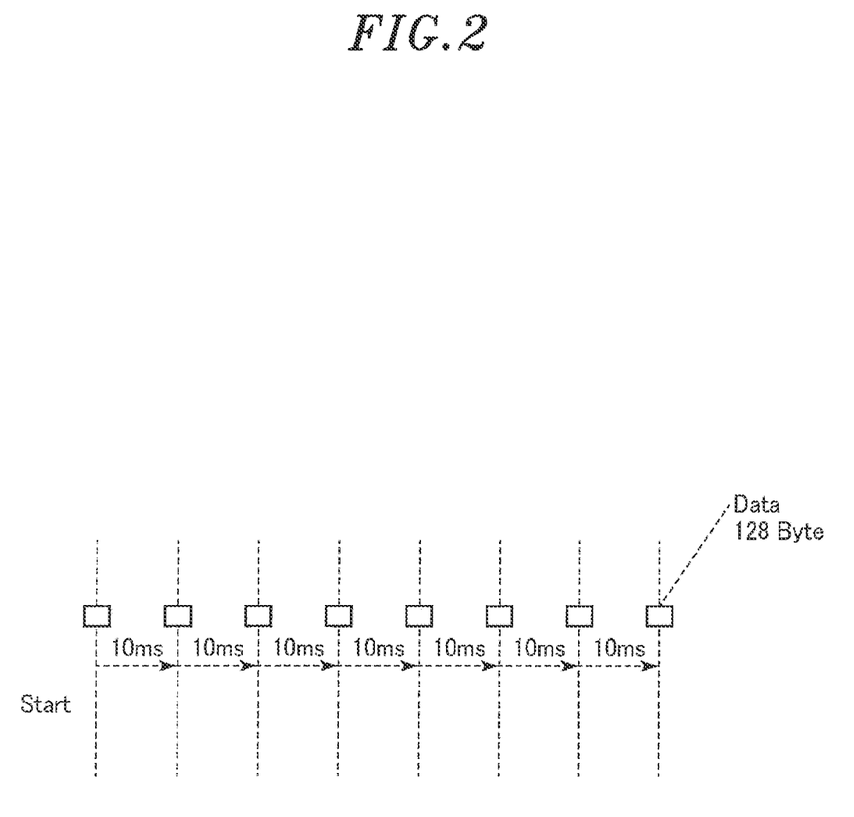
FIG. 2 is a diagram for describing a state of transmitting data of 128 bytes at a period of 10 ms by using Wi-Fi according to an embodiment.
Figure 3:
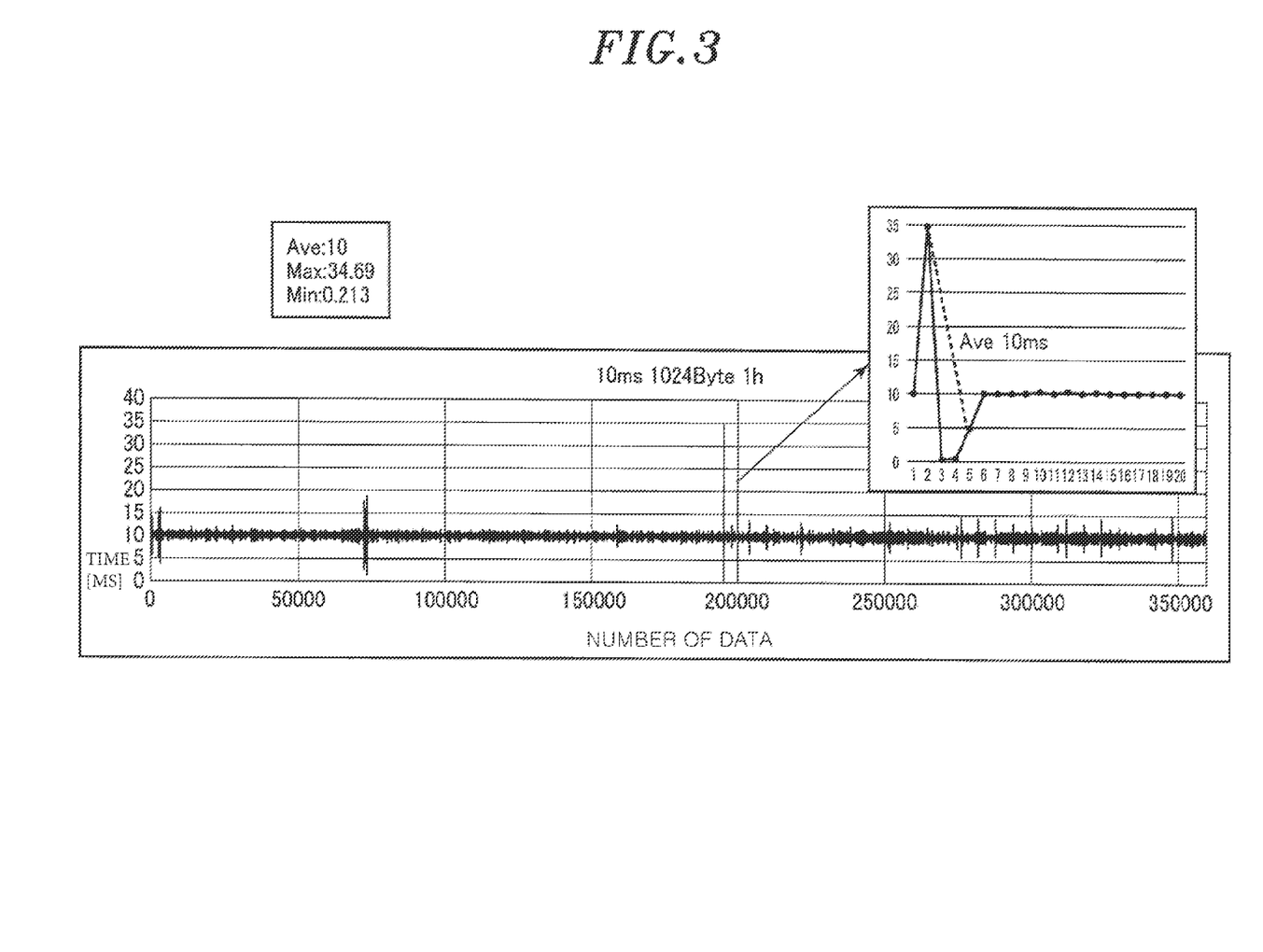
FIG. 3 is a diagram illustrating a time until data reaches a client CL from an access point AP when transmitting the data of 128 bytes for approximately 1 hour at the period of 10 ms according to an embodiment.

For example, when data of 128 bytes is transmitted at a period of 10 ms by using Wi-Fi as illustrated in FIG. 2, actual measurement data is illustrated in FIG. 3. FIG. 3 is a diagram illustrating a time until data reaches a client CL from an access point AP when transmitting the data of 128 bytes for approximately 1 hour at the period of 10 ms, and a part thereof is enlarged and illustrated. As illustrated in FIG. 3, it can be seen that a mean value of a reach time of the data is approximately 10 ms, but the value largely varies from 2 to 35 ms, and the reach time of the data is unstable.

When the data reach time is unstable as such, it is difficult to synchronize the data with the plurality of second devices 500, for example, simultaneously transmit the data to the plurality of second devices 500 from the first device 400 by using the wireless communication system 100.

Therefore, in the wireless communication system 100 according to the embodiment, the first control portion 202 and the second control portion 302 synchronize the first wireless device 200 and the plurality of second wireless devices 300 when a time until the first wireless device 200 receives the response from the second wireless device 300 after the first wireless device 200 transmits the periodic data from the first device 400 is equal to or less than a set value.

Specifically, first, the first wireless device 200 creates data acquired by including the first timer value to the periodic data, and measures a response time until the first wireless device 200 receives the response from the second wireless device 300 after the first wireless device 200 transmits the data.

Next, the first wireless device 200 determines whether the response time is equal to or less than the set value, and transmits to the second wireless device 300 the flag jointly with the data acquired by including the first timer value when the response time is equal to or less than the set value.

The second wireless device 300 receives the data acquired by including the first timer value transmitted by the first wireless device 200, and then writes the difference between the first timer value and the second timer value.

Next, when the second wireless device 300 receives the data jointly with the flag from the first wireless device 200, the second wireless device 300 rewrites the second timer value based on the difference between the first timer value and the second timer value, and establishes the synchronization relationship of the first wireless device 200 and the plurality of second wireless devices 300. Therefore, the plurality of second wireless devices 300 may be synchronized with each other, and the periodic data from the first device 400 may be synchronized with the plurality of second devices 500, for example, simultaneously transmitted.

Figure 4:
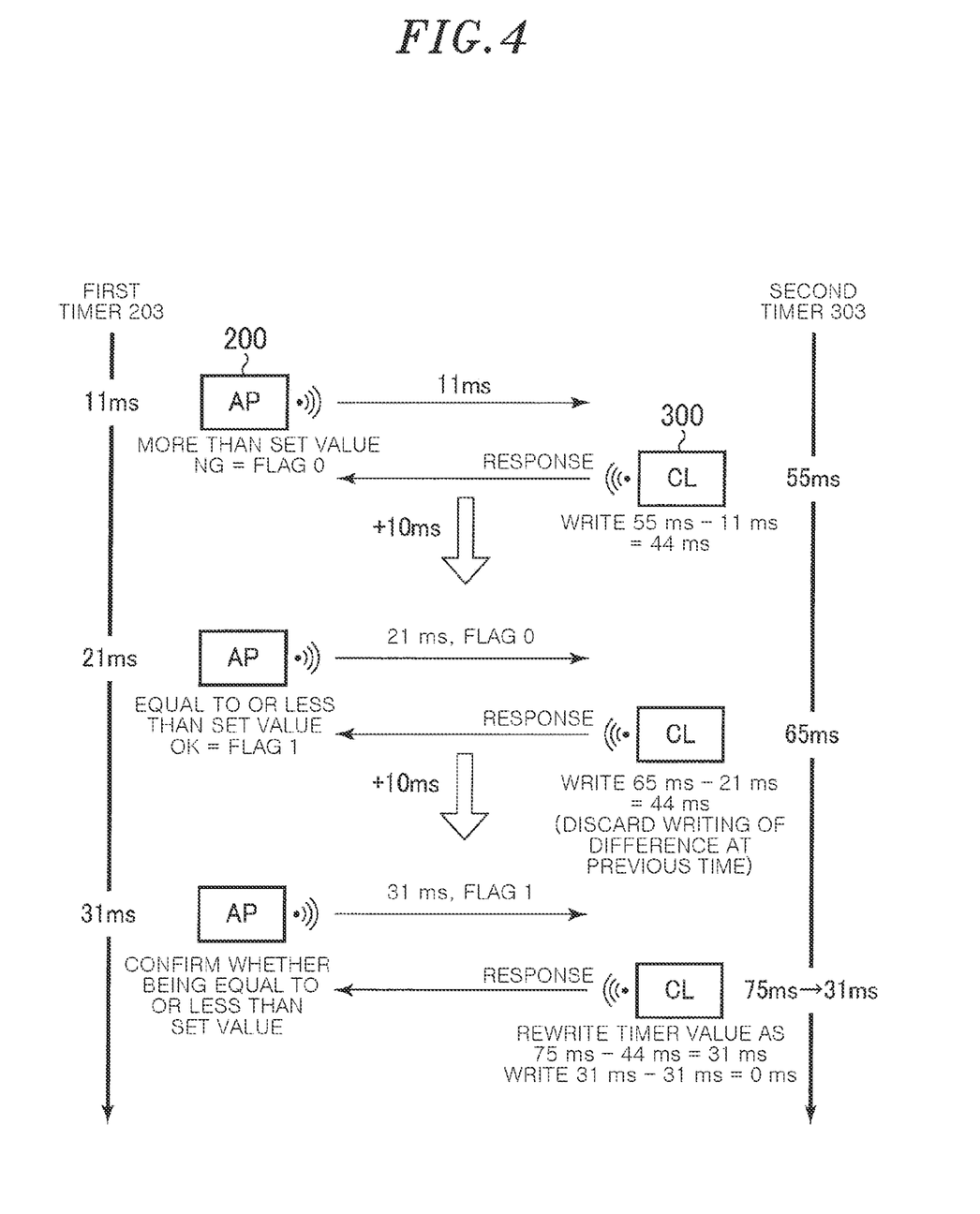
FIG. 4 is a diagram illustrating a specific flow of a wireless communication operation in a wireless communication system according to an embodiment.

Hereinafter, a specific flow will be described with reference to FIG. 4.

Here, a case where the first wireless device 200 is the access point AP, the plurality of second wireless devices 300 is the client CL, and data is transmitted from the first device 400 at the cycle of 10 ms will be described as an example.

First, initial data from the first device 400 is transmitted from the AP 200 to the CL 300. In this case, the first timer value of the first timer 203 of the AP 200 is 11 ms, and the transmission data generation portion 204 generates and transmits data acquired by including 11 ms as the first timer value.

When the time value of the second timer 303 is 55 ms, the CL 300 receives the initial data transmitted from the AP 200, and responds to the first wireless device 200. In this case, the timer value writing portion 304 of the CL 300 writes a difference between the second timer value of the second timer 303 and the first timer value of the received data, i.e., 55 ms−11 ms=44 ms.

When the AP 200 has received the response, the reception data monitor unit 205 monitors the time until receiving the response from the CL 300 after the data is transmitted, and the reception data determination portion 206 determines whether a time until receiving the response monitored by the reception data monitor portion 205 is equal to or less than a set value. In this case, since, as the time until receiving the response, a time larger than the set value, e.g., 5 ms, is taken as compared with a case where the set value (shortest time +2%) is 1.95 ms, the reception data determination portion 206 determines NG, and the flag generation portion 207 sets flag 0.

Next, next data from the first device 400 is transmitted from the AP 200 to the CL 300. The time in this case is 10 ms after the initial data, and the first timer value of the first timer 203 of the AP 200 is 21 ms. The transmission data generation portion 204 generates and transmits data acquired by including 21 ms which is the first timer value and reflecting flag 0 of the previous time.

When the time value of the second timer 303 is 65 ms, the CL 300 receives the next data, and responds to the first wireless device 200. In this case, the timer value writing portion 304 of the CL 300 writes a difference between the second timer value of the second timer 303 and the first timer value of the received data, i.e., 65 ms−21 ms=44 ms.

Similarly, when the AP 200 has received the response, the reception data monitor unit 205 monitors the time until receiving the response from the CL 300 after the data is transmitted, and the reception data determination portion 206 determines whether a time until receiving the response is equal to or less than the set value. In this case, since the time until receiving the response is equal to or less than the set value, the reception data determination portion 206 determines OK, and the flag generation portion 207 generates flag 1.

Next, additional next data from the first device 400 is transmitted from the AP 200 to the CL 300. The time in this case is 10 ms after the next data, and the value of the first timer 203 of the AP 200 is 31 ms. The transmission data generation portion 204 transmits data acquired by including 31 ms which is the first timer value and flag 1.

When the second timer value of the second timer 303 is 75 ms, the CL 300 receives the additional next data, and responds to the first wireless device 200. In this case, the flag determination portion 305 determines that flag 1 is attached to the received data, and the timer value rewriting portion 306 rewrites the second timer value of the second timer 303 itself with a value acquired by subtracting the difference value written on the timer value writing portion 304 from the second timer value of the second timer 303 at that time, i.e., 75 ms−44 ms=31 ms. In this case, a difference of 0 (31 ms−31 ms=0 ms) is written on the timer value writing portion 304 as compared with a next flag.

Similarly, when the AP 200 has received the response, the reception data monitor unit 205 monitors the time until receiving the response from the CL 300 after the data is transmitted, and the reception data determination portion 206 confirms whether a time until receiving the response is equal to or less than the set value.

As such, with respect to the received data, flag 1 is generated when the AP receives the response within a set time, and upon transmitting the next data, the data is acquired by including flag 1, and the second timer value of the second timer 303 itself is rewritten with a value acquired by subtracting the difference value written on the timer value writing portion 304 from the second timer value at that time based on the data. Such an operation is performed with respect to a plurality of CLs 300 to synchronize the AP 200 and the plurality of CLs 300, and synchronize the plurality of CLs 300. As a result, the periodic data from the first device 400 may be synchronized with respect to the plurality of second devices 500, for example, simultaneously transmitted.

Further, when the first device 400 and the second device 500 are the control devices, there is a case where the synchronization misalignment occurs between the plurality of second devices 500 by a deviation of an oscillator (clock) having a crystal oscillator which is a reference of the time in the control device, but as described below, the synchronization misalignment may be suppressed by the wireless communication system 100 according to the embodiment.

The synchronization misalignment occurs due to accumulation of a tiny quantity of errors over a long period of time, but in the wireless communication system 100 according to the embodiment, when communication at the set time or less is established, synchronicity is established in the plurality of second devices 500 to suppress instability of periodic communication or the synchronization misalignment.

<Substrate Processing Apparatus>

Next, the substrate processing apparatus using the control device having the wireless communication system will be described. Here, as an example of the substrate processing apparatus, a film forming apparatus that forms a film on a substrate by atomic layer deposition ALD by using raw gas and reaction gas is used, but the substrate processing apparatus is not limited thereto.

Figure 5:
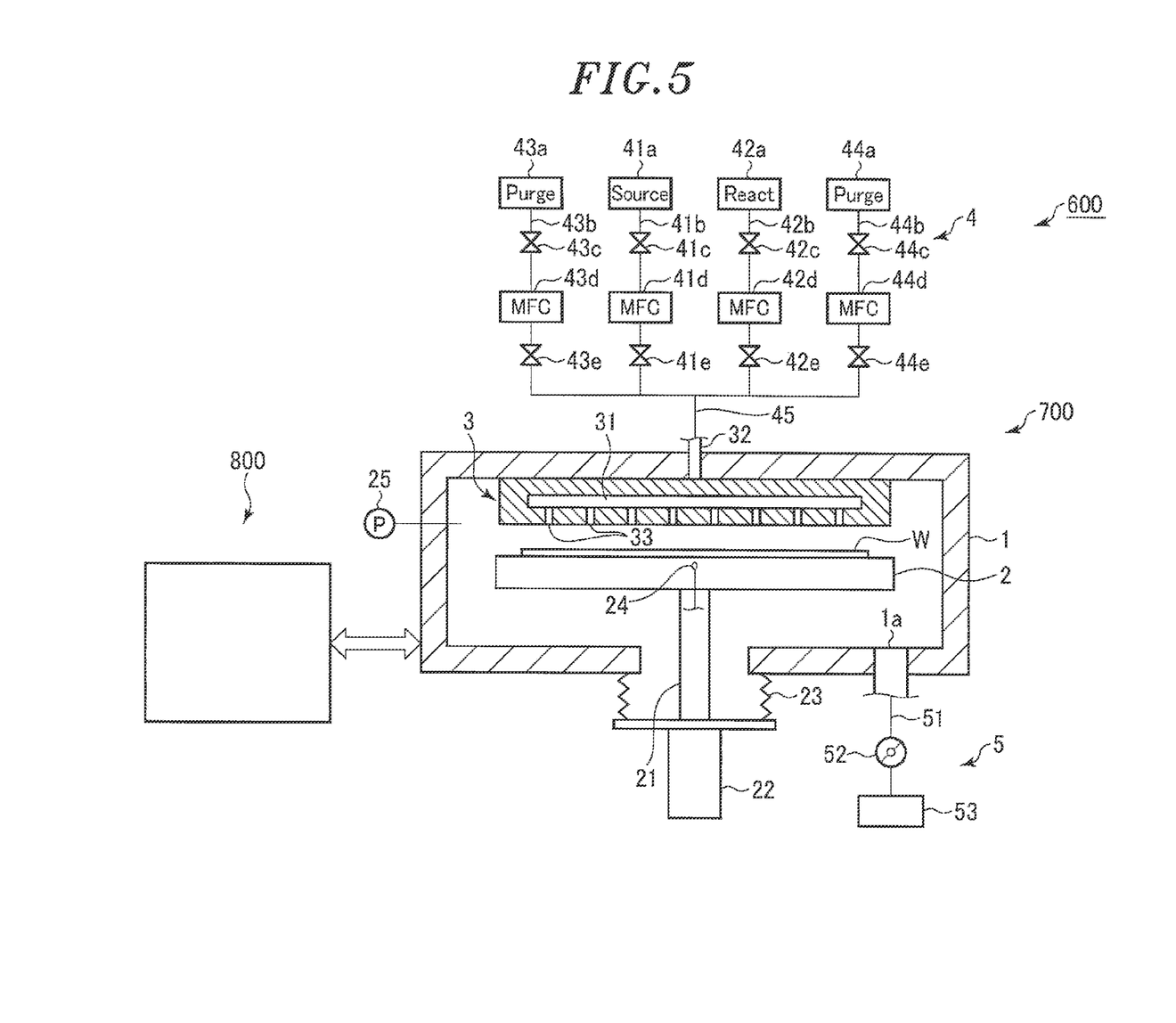
FIG. 5 is a cross-sectional view illustrating a substrate processing apparatus using a control device having a wireless communication system according to an embodiment.

FIG. 5 is a cross-sectional view illustrating a substrate processing device using a control device having a wireless communication system according to an embodiment. As illustrated in FIG. 5, a substrate processing apparatus 600 includes a substrate processing portion 700 and a control device 800.

The substrate processing portion 700 includes a processing container 1, a boarding platform 2, a shower head 3, a gas supply portion 4, and an exhaust portion 5.

The processing container 1 is made of metal such as aluminum, and has an approximately cylindrical shape. A loading/unloading hole (not illustrated) for loading/unloading a substrate W is formed on a side wall of the processing container 1, and the loading/unloading hole is openable/closable by a gate valve (not illustrated). Further, an exhaust port 1a is installed on the bottom of the processing container 1.

The boarding platform 2 has a disk shape having a size corresponding to the substrate W, and is horizontally installed in the processing container 1 and supported on a support member 21. The boarding platform 2 is made of a ceramics material such as aluminum nitride (AlN), or a metallic material such as aluminum or a nickel base alloy, and is buried with a heater (not illustrated) for heating the substrate W therein, and the heater is heated by power supply from a heater power source (not illustrated). A temperature sensor 23 is installed in the vicinity of an upper surface of the boarding platform 2, and a temperature of the substrate W is controlled by controlling an output of the heater by the temperature sensor.

The support member 21 is extended downward of the processing container 1 by penetrating a hole formed on a bottom wall of the processing container 1 from the center of the bottom of the boarding platform 2, and a lower end of the support member 21 is connected to an elevation mechanism 22. The boarding platform 2 is elevatable through the support member 21 by the elevation mechanism 22. The boarding platform 2 is elevated by the elevation mechanism 22 during an ALD process to vary a pressure in the vicinity of the substrate W.

A bellows 23 is installed between the support member 21 and the bottom wall of the processing container 1, which partitions an atmosphere in the processing container 1 from outdoor air, and expands and contracts according to an elevation operation of the boarding platform 2.

A shower head 3 is installed at an upper portion of the processing container 1 to be opposite to the boarding platform 2, and serves as a gas discharge portion that discharges processing gas in the processing container 1 in a shower shape. The shower head 3 is made of, for example, the metallic material, and has an almost the same diameter as the boarding platform 2. A gas diffusion space 31 is formed inside the shower head 3, which diffuses gas, and a gas introduction pipe 32 is connected to the gas diffusion space 31 from the top. Multiple gas discharge holes 33 are formed on the bottom wall of the shower head 3, and gas supplied to the gas diffusion space 31 from the gas introduction pipe 32 is configured to be discharged into the processing container 1 from a gas discharge hole 33.

The gas supply portion 4 is used for supplying gas such as the raw gas, the reaction gas, purge gas, etc., used for ALD film forming to the processing container 1 through the shower head 3. The raw gas is compound gas containing a metallic component of a film to be formed, and the reaction gas is gas for forming the film by reacting with the raw gas. Further, the purge gas is used for purging gas which remains in the processing container 1, and inert gas such as $N_2$ gas or rare gas is used as the purge gas.

The gas supply portion 4 includes a raw gas supply source 41a supplying the raw gas, a reaction gas supply source 42a supplying the reaction gas, and a first purge gas supply source 43a and a second purge gas supply source 44a supplying the purge gas.

A raw gas supply pipe 41b, a reaction gas supply pipe 42b, a first purge gas supply pipe 43b, and a second purge gas supply pipe 44b are connected to the raw gas supply source 41a, the reaction gas supply source 42a, the first purge gas supply source 43a, and the second purge gas supply source 44a, respectively. A front-side valve 41c, a flow controller 41d, and a rear-side valve 41e are installed in the raw gas supply pipe 41b in order from the raw gas supply source 41a. A front-side valve 42c, a flow controller 42d, and a rear-side valve 42e are installed in the reaction gas supply pipe 42b in order from the reaction gas supply source 42a. A front-side valve 43c, a flow controller 43d, and a rear-side valve 43e are installed in the first purge gas supply pipe 43b in order from the first purge gas supply source 43a. A front-side valve 44c, a flow controller 44d, and a rear-side valve 44e are installed in the second purge gas supply pipe 44b in order from the second purge gas supply source 44a.

The raw gas supply pipe 41b, the reaction gas supply pipe 42b, the first purge gas supply pipe 43b, and the second purge gas supply path 44b join a common pipe 45, and the common pipe 45 is connected to the gas introduction pipe 32.

The first purge gas supply pipe 43b and the second purge gas supply pipe 44b are installed on the raw gas supply pipe 41b and the reaction gas supply pipe 42b, respectively, and the purge gas which passes through the pipes also serves as carrier gas of each of the raw gas and the reaction gas.

The front-side valves 41c, 42c, 43c, and 44c are normal opening/closing valves, and the rear-side valves 41e, 42e, 43e, and 44e are high-speed opening/closing valves for the ALD. The valves are solenoid valves opening/closing-driven by using a solenoid. As the flow controllers 41d, 42d, 43d, and 44d, for example, mass flow controllers are used. Further, flow meters are also installed.

The exhaust portion 5 exhausts the inside of the processing container 1 to depressurize the inside of the processing container 1. The exhaust portion 5 includes an exhaust pipe 51, an automatic pressure control valve (APC) 52, and a vacuum pump 53. The exhaust pipe 51 is connected to an exhaust port 1a. The automatic pressure control valve (APC) 52 and the vacuum pump 53 are interposed in the exhaust pipe 51. As the automatic pressure control valve (APC) 52, a valve for controlling conductance in the exhaust pipe 51 by adjusting an opening level may be used. The opening level of the automatic pressure control valve (APC) 52 is controlled so that a pressure value of the pressure sensor 25 detecting a pressure in the processing container 1 becomes a desired value.

In the substrate processing portion 700, a process below is executed by a control of a control device 800 to be described below.

First, the substrate W is loaded into the processing container 1 and boarded on the boarding platform 2, a predetermined depressurization state is maintained inside the processing container 1, and a temperature of the boarding platform 2 is controlled to a set temperature by the heater. In this state, the purge gas is supplied into the processing container 1 from the gas supply portion 4 through the shower head 3, and the gas inside the processing container 1 is purged.

Thereafter, the high-speed opening/closing valves 41e to 44e for the ALD are opened/closed at a high speed, and supplying of the raw gas into the processing container 1, purging of remaining gas inside the processing container 1, supplying of the reaction gas into the processing container 1, and purging of the remaining gas inside the processing container 1 are performed repeatedly at the high speed. Therefore, an ALD process in which adsorption of the raw gas on the substrate W and film forming by reaction off the raw gas and the reaction gas are repeated is performed, and a film having a set film thickness is formed on the substrate W.

In the ALD, in each step, high-speed pressure control by the automatic pressure control valve (APC) 52 and high-speed elevation of the boarding platform 2 by the elevation mechanism 22 are performed.

Next, the control device 800 will be described in detail.

Figure 6:
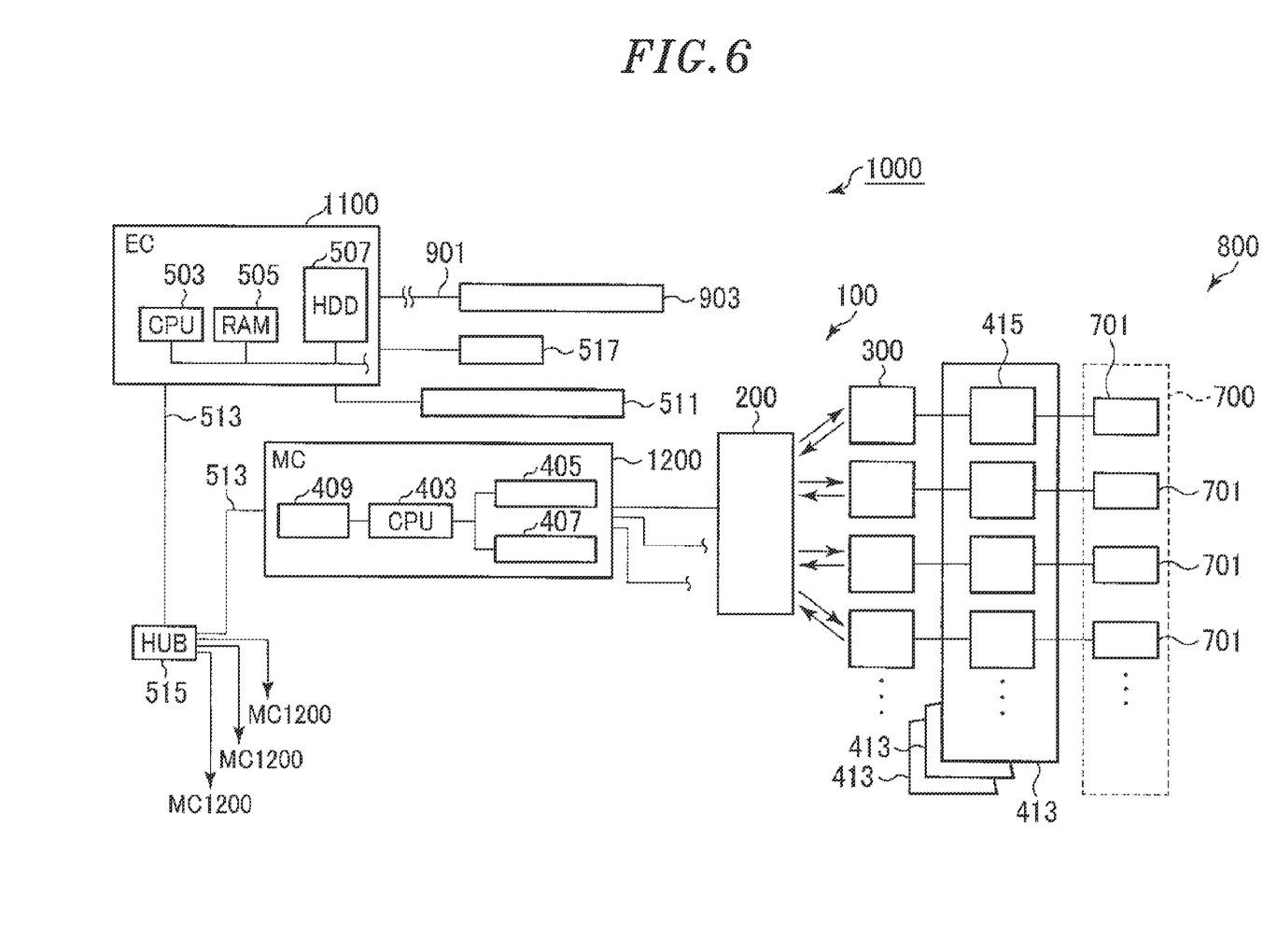
FIG. 6 is a block diagram illustrating a schematic configuration of a total control system including the control device controlling the substrate processing apparatus illustrated in FIG. 5 according to an embodiment.

FIG. 6 is a block diagram illustrating a schematic configuration of a total control system including the control device controlling the substrate processing device of FIG. 5 according to one embodiment.

The control device 800 is used for controlling each component constituting the substrate processing portion 700, and executing the processing in the substrate processing apparatus 600. The control device 800 is configured as a part of a total control system 1000 for controlling the entirety of the substrate processing system including the substrate processing apparatus 600, and has the wireless communication system 100.

As illustrated in FIG. 6, the total control system 1000 includes an equipment controller (EC) 1100 which is a coordination portion controlling the entire substrate processing system, and a plurality of module controllers (MCs) 1200 controlling each device (module) constituting the substrate processing system, which is present at a lower layer thereof.

The EC 1100 serves as a common higher control portion that controls a plurality of apparatuses of the substrate processing system, and includes the substrate processing apparatus 600 as one of the plurality of apparatuses (modules). Apparatuses other than the substrate processing apparatus 600 may include, for example, a load lock room, a loader unit, etc. A plurality of MCs 1200 are installed to correspond to the plurality of apparatuses (modules), but in FIG. 6, only the MC 1200 of the substrate processing apparatus 600 is illustrated, and other apparatuses are omitted.

The control device 800 includes the EC 1100, the MC 1200 corresponding to the substrate processing apparatus 600, and a plurality of I/O modules 413 installed at a lower layer thereof. A plurality of I/O boards 415 are mounted on the plurality of I/O modules 413, respectively, and an end device 701 which is a high-speed control device for performing the processing in the substrate processing portion 700 is connected to each I/O board 415. The end device 701 is the high-speed opening/closing valves 41e to 44e in the gas supply portion 4, the flow controllers 41d to 44d, the automatic pressure control valve (APC) 52 of the exhaust portion 5, the elevation mechanism 22, sensors such as a pressure meter 25, etc., and is a generic term thereof.

The EC 1100 includes a central processing unit (CPU) 503, a ROM 505 as a volatile memory, and a hard disk device 507 as a storage portion. The EC 1100 and each MC 1200 are connected by a network 513. The network 513 has a switching hub 515. The switching hub 515 performs switching of the MC 1200 as a connection destination of the EC 1100 according to a control signal from the EC 1100.

Further, the EC 1100 as a manufacturing execution system (MES) that manages a manufacturing process of an entire factory in which the substrate processing system is installed is connected to a host computer 903 through a network 901.

Further, a user interface 511 is also connected to the EC 1100. The user interface 511 includes a keyboard performing an input manipulation of a command, a display visualizing and displaying an operation state of the substrate processing system, a machine switch, etc., in order for a process manager to manage the substrate processing system.

The EC 1100 is configured to write information on a computer-readable storage medium 517, and read information from the storage medium 517.

In the EC 1100, the CPU 503 reads a program including a processing recipe of the substrate W designated by a user in the user interface 511 from the hard disk device 507 or the storage medium 517. In addition, the program including the processing recipe is configured to be transmitted to the plurality of MCs 1200 from the EC 1100. As described above, one of the plurality of MCs 1200 corresponds to the control device 800 of the substrate processing apparatus 600.

The MC 1200 included in the control device 800 and corresponding to the substrate processing apparatus 600 includes a CPU 403, a volatile memory portion 405 such as the RAM, a non-volatile memory portion 407 as an I/O information storage portion, and an I/O control portion 409.

Various history information in the substrate processing apparatus 600 is conserved in the non-volatile memory portion 407. Further, the non-volatile memory portion 407 which also serves as the I/O information storage portion is configured to frequently write and store various I/O information exchanged between the MC 1200 and a plurality of end devices 701 provided in the substrate processing portion 700 on the non-volatile memory portion 407 as described below.

The I/O control portion 409 of the MC 1200 transmits various control signals to the I/O board 415 of the I/O module 413, or receives a signal such as status information regarding each end device 701 from the I/O board 415.

The control of each end device 701 by the MC 1200 is performed by the I/O board 415. The I/O board 415 transfers the control signal to each end device 701 or an input signal from the end device 701. The I/O board 415 and each end device 701 are connected to each other with a digital/analog signal.

The wireless communication system 100 is installed between the MC 1200 and the I/O board 415. The wireless communication system 100 includes the first wireless communication device 200 and the plurality of second wireless communication devices 300 as described above, and the MC 1200 corresponds to the first device 400 and the I/O board 415 to which the end device 701 is connected corresponds to the second device 500. That is, the wireless communication system 100 performs communication of the control signal as data between the MC 1200 which is the higher control unit and the I/O board 415 which is the lower control unit.

Further, FIG. 6 illustrates a state in which the MC 1200 and the plurality of I/O boards 415 of one I/O module 413 perform wireless communication in the wireless communication system 100, but a plurality of wireless communication systems 100 may be installed to correspond to the plurality of I/O modules 413. In this case, a plurality of channels may be installed in the MC 1200, and the first wireless device 200 of the wireless communication system 100 may be connected to each channel.

Input/output information managed by the I/O board 415 includes digital input information DI, digital output information DO, and analog input information AI. The digital input information DI relates to digital information input into the higher MC 1200 from each lower end device 701. The digital output information DO relates to digital information output to each lower end device 701 from the higher MC 1200. The analog input information AI relates to analog information input into the MC 1200 from each end device 701.

The digital input information DI and the analog input information AI include, for example, information regarding a state of each end device 701. The digital output information DO includes, for example, a command of setting of a value for a process condition for each end device. In other words, the digital input information DI and the analog input information AI are, for example, sensors such as the pressure meter, the flow sensor, the temperature sensor, etc., which perform monitoring processing of the device, and the digital output information DO is, for example, an operating system such as the high-speed opening/closing valve, the elevation mechanism, the automatic pressure control valve (APC), etc., which performs a manipulation of the device.

The digital input information DI, the digital output information DO, and the analog input information AI are granted with I/O addresses to correspond to respective contents. Each I/O address includes, for example, 16-bit (0 to 15) digital information or analog information. The analog information is expressed as, for example, a hexadecimal number of 0 to FFFF. Further, an address number is allocated to each I/O address. Further, a node number starting from a number 1 is allocated to the I/O board 415. In addition, numbers are granted to a plurality of channels. Therefore, the I/O addresses of the digital input information DI, the digital output information DO, and the analog input information AI may be configured to be specified by three types of parameters including a channel number, a node number, and an I/O address number.

Next, a control operation of the control device 800 in the substrate processing apparatus 600 configured as such will be described.

In the substrate processing apparatus 600, the ALD process is performed as an example of the substrate processing, and the ALD process is performed by controlling the plurality of end devices 701 of the substrate processing portion 700 by the control device 800 based on the processing recipe.

First, in the control device 800 having the configuration illustrated in FIG. 6, the processing recipe for performing the processing of the substrate W is transmitted from the EC 1100 to the MC 1200 corresponding to the substrate processing apparatus 600. In addition, the MC 1200 transmits the periodic data for controlling the I/O board 415 through the wireless communication system based on the processing recipe, and controls the end device 701 connected to the I/O board 415.

In the related art, multiple end devices such as the solenoid valve or the pressure meter are installed in the substrate processing apparatus such as the ALD film forming apparatus, and in order to control the end devices, multiple signal cables are wired from the MC 1200 which is the higher control device in order to control multiple end devices through the I/O module 413 and the I/O board 415, in order to control the end device. As a result, a large space is required for the signal cable, and it is difficult to minimize the device.

Contrary to this, in the embodiment, by installing the wireless communication system 100 between the MC 1200 of the substrate processing apparatus 600, and the plurality of I/O boards 415, and performing the wireless communication, the signal cable may be reduced and the miniaturization of the device may be achieved.

However, in the case of transmitting the periodic data by the wireless communication, a deviation in communication time for the period occurs due to the surrounding disturbance or the deterioration of the communication environment as described above unlike the case of the wired communication in the related art. When the devices are connected by a wired communication interface or an I/O cable, the devices shares a synchronization signal to be synchronized with each other, so such a problem does not occur, but since there is no connection by an electrical signal in the wireless communication, the synchronization signal may not be used.

Figure 7A:
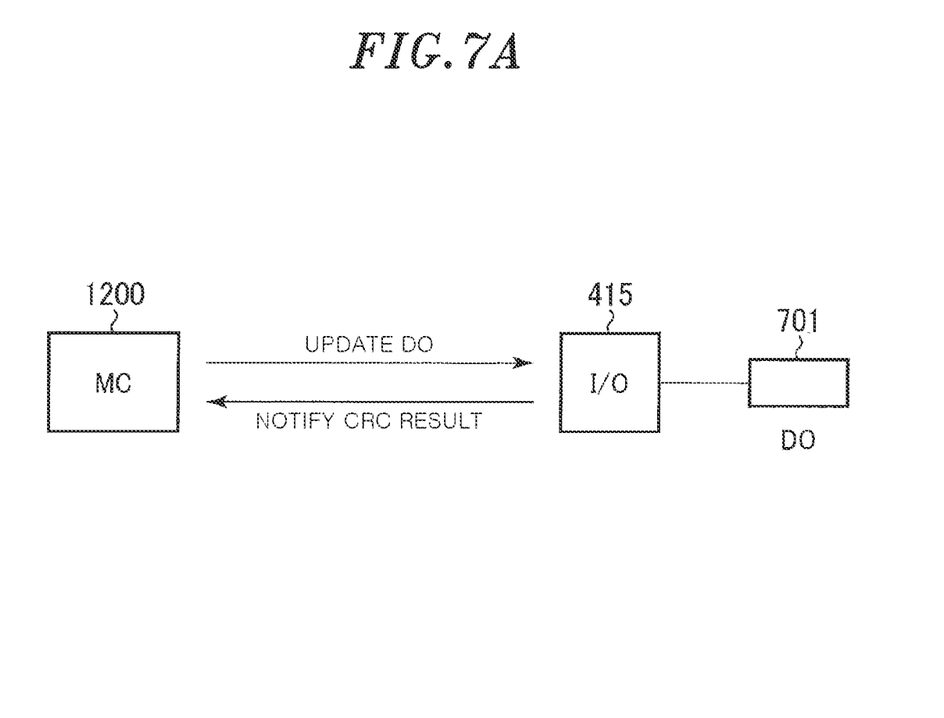
FIGS. 7A and 7B are diagrams for describing states in which control data is transmitted to end devices respectively connected through a plurality of 110 boards from an MC, and the MC receives a response thereto according to an embodiment.

When the end devices 701 of the operating system into which the DO is input are connected to the plurality of I/O boards 415, respectively, it may be requested that the end devices 701 operate in synchronization with each other, but when the deviation in communication time occurs as described above, it is difficult to realize a synchronization operation. Specifically, as illustrated in FIG. 7A, DO update data is transmitted from the MC 1200 to the end devices 701 respectively connected through the plurality of I/O boards 415, and data of a CRC result is replied to the MC 1200 from the end device 701. In this case, when there is the deviation in communication time, a deviation occurs in an output timing of the DO update date to the plurality of I/O boards 415 from the MC 1200, and data may not be transmitted synchronously (e.g., simultaneously).

Figure 7B:
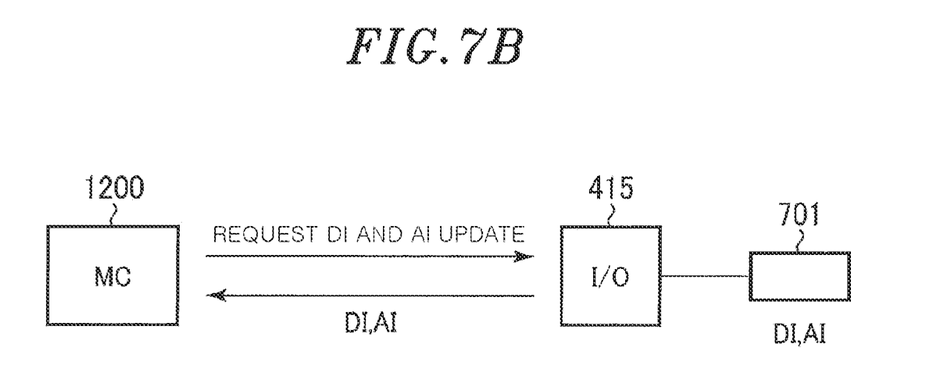

When the end device 701 acquires the DI and the AI, it may be requested that a data acquisition timing is matched from the end device 701, but when the deviation in communication time occurs, it is difficult to match the data acquisition timing. Specifically, as illustrated in FIG. 7B, digital input information DI and analog input information AI update request data are transmitted from the MC 1200 to the end devices 701 respectively connected through the plurality of I/O boards 415, and the digital input information DI and analog input information AI data are replied to the MC 1200 from the end device 701. In this case, when there is the deviation in communication time, the deviation occurs in the output timing of the DI and AI update data to the plurality of I/O boards 415 from the MC 1200, so it is difficult to match the data acquisition timing regardless of a control cycle (1 ms, 10 ms, etc.).

Therefore, the first wireless device (AP) 200 and the plurality of second wireless devices (CLs) 300 are synchronized with each other when the time until the first wireless device (AP) 200 receives the response from the second wireless device (CL) 300 after the first wireless device (AP) 200 transmits the periodic data is equal to or less than the set value. As a result, the periodic data from the MC 1200 corresponding to the first device 400 is synchronized with respect to the I/O board 415 corresponding to the plurality of second devices 500 to be transmitted synchronously, for example, simultaneously.

Further, by using the technology that transmits data synchronously (simultaneously) between the plurality of I/O boards 415 corresponding to the plurality of second devices 500 by using the wireless communication system 100, the synchronization misalignment between the devices may also be suppressed even in the case of the wired connection.

Hereinafter, such an operation will be described in detail.

The control device such as the MC 1200 or the I/O board 415 operates based on the oscillator (clock) having the crystal oscillator. A frequency may be changed by using a PLL embedded in the control device, but original oscillation is made by the oscillator. That is, a counter/timer inside the control device is calculated based on a period of the oscillator. However, since an entity difference is individually present in the oscillator, the misalignment particularly occurs at a period made from another oscillator even though a nominal frequency is the same. As a result, among the plurality of control devices, in the case of the example, the misalignment of the period occurs between the plurality of I/O boards 415.

The misalignment of the period is approximately ±25 ppm, and for example, in the case of an oscillator of 25 MHz, the misalignment of the period becomes a range of 25 MHz ±625 Hz, i.e., 24.999375 MHz to 25.000625 MHz, and the period becomes 40.001 ns to 39.999 ns. When 1 second is measured at 40 ns, a 25-million count accurately becomes 1 second (1000 ms). Since a 25-million count of 39.999 ns is 999.975 ms and a 25-million count of 40.001 ns is 1000.025 ms, 1 second is varied in a range of 999.975 ms to 10000.025 ms in the case of the 25-MHz oscillator. Such an error is small, but the accumulation of the small errors causes a large synchronization misalignment.

Figure 8:
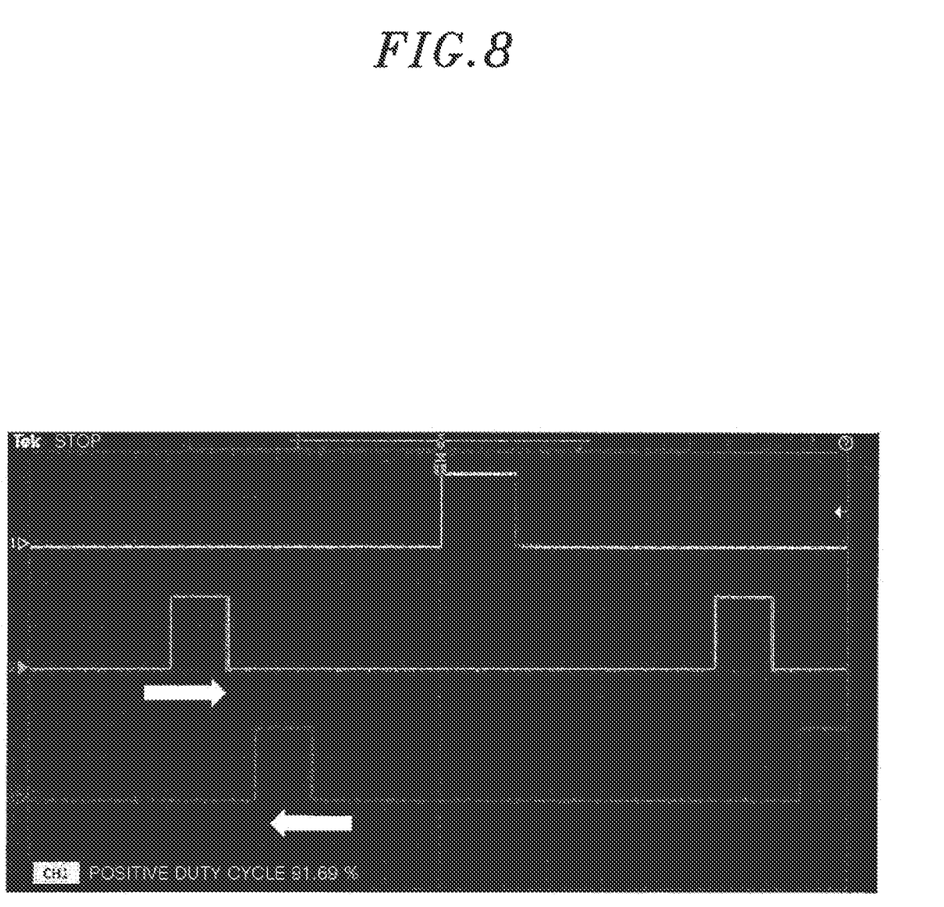
FIG. 8 is a chart illustrating an experimental result of confirming synchronization misalignment according to an embodiment.

FIG. 8 is a chart illustrating an experimental result of confirming synchronization misalignment according to one embodiment. Here, three microcomputer boards are listed, and a signal which becomes high at the period of 10 ms, and measured by an oscilloscope for approximately 8 minutes. As illustrated in the figure, it is confirmed that a second microcomputer board and a third microcomputer board are misaligned based on a first microcomputer board. When the devices are used for DO output and DI sampling at this time, the devices are not synchronized with each other.

Contrary to this, by employing a method for synchronizing the AP 200 and the CL 300 by updating the timer value when the time until the AP 200 transmits the periodic data and receives the response is equal to or less than the set value according to the wireless communication system 100 of the embodiment, the synchronization misalignment may also be suppressed, which is caused by the deviation of the oscillator.

Figure 9:
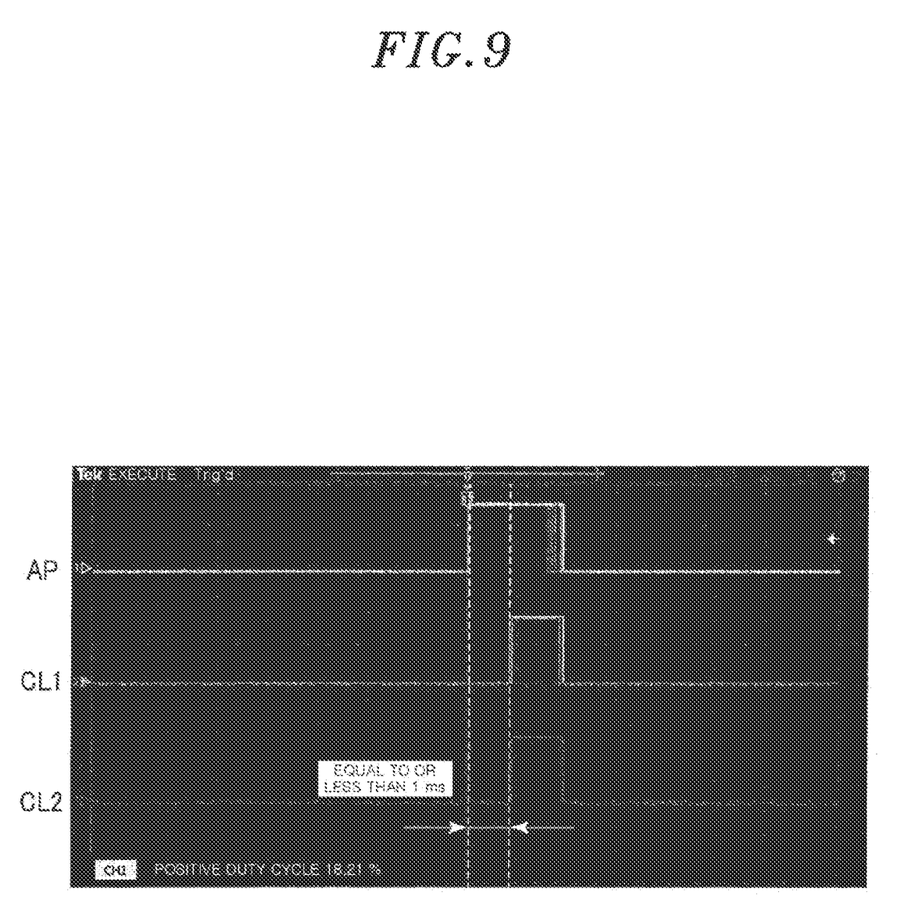
FIG. 9 is a chart illustrating an experimental result of confirming synchronization by using a wireless communication system according to an embodiment.

FIG. 9 is a chart illustrating an experimental result of confirming synchronization by using a wireless communication system according to an embodiment. Here, the microcomputer board corresponding to the AP and two microcomputer boards corresponding to the CL are listed, and the wireless communication according to the embodiment is performed by multicast by using the signal which becomes high at the period of 10 ms, and measurement is performed by the oscilloscope for approximately 8 minutes. As illustrated in the figure, even though 8 minutes elapsed, waveform movement of CL1 and CL2 based on the AP is not viewed. In the timer of the CL, a delay of 1 ms or less occurs with respect the AP for a time when data is sent from the AP to the CL, but CL1 and CL2 are completely synchronized with each other.

<Other Applications>

Hereinabove, the embodiment is described, and it should be considered that the embodiment disclosed in this case is exemplary and is not limited in terms of all aspects. The embodiment may be omitted, substituted, or changed in various forms without departing from the appended claims and a major point.

For example, in the embodiment, the control devices are illustrated as the first device and the plurality of second devices adopting the wireless communication system, but any device which is used for communication of the periodic data may be used and it is not limited thereto.

Further, in the embodiment, an example of configuring the control portion of the substrate processing apparatus by using the wireless communication system between the MC as the higher control unit and the I/O board as the lower control unit is described, but is not limited thereto. Further, as the substrate processing apparatus, the apparatus that performs the ALD film forming is described as an example, but the substrate processing apparatus is not limited to the ALD film forming apparatus.

What is claimed is:

1. A wireless communication system for transmitting periodic data from a first device to a plurality of second devices by wireless communication, the wireless communication system comprising:
   a first wireless device connected to the first device; and
   a plurality of second wireless devices connected to the plurality of second devices, respectively,
   wherein the first wireless device includes a first wireless portion performing the wireless communication and a first control portion controlling the first wireless portion,
   a second wireless device includes a second wireless portion performing the wireless communication and a second control portion controlling the second wireless portion, and
   the first control portion and the second control portion synchronize the first wireless device and the plurality of second wireless devices when a time until the first wireless device receives a response from the second wireless device after the first wireless device has transmitted the periodic data from the first device is equal to or less than a set value.

2. The wireless communication system of claim 1, wherein the first control portion creates a first data acquired by including a first timer value to the periodic data, and measures a response time until the first wireless device receives the response from the second wireless device after the first wireless device has transmitted the first data, and determines whether the response time is equal to or less than the set value, and transmits a flag jointly with a second data when the response time is equal to or less than the set value, and the second control portion writes a difference between a second timer value of the second wireless device and the first timer value of the first wireless device when the second wireless device receives the first data transmitted from the first wireless device, and when the second wireless device receives the second data jointly with the flag in which the response time is equal to or less than the set value, rewrites the second timer value based on the difference, and establishes a synchronization relationship of the first wireless device and the plurality of second wireless devices.

3. The wireless communication system of claim 2, wherein the first control portion includes:

a first timer measuring the time in the first wireless device;

a transmission data generation portion generating the first data acquired by including the first timer value of the first timer to the periodic data from the first device;

a reception data monitor portion monitoring the response time until the first wireless device receives the response from the second wireless device after transmitting the first data from the first wireless device;

a reception data determination portion determining whether the response time monitored by the reception data monitor portion is equal to or less than the set value; and a flag generation portion generating the flag when the response time is equal to or less than the set value, and the second control portion includes:

a second timer measuring the time in the second wireless device;

a timer value writing portion writing a difference between the second timer value of the second timer and the first timer value of the received data;

a flag determination portion determines flag information of the received data; and in a case of receiving data attached with the flag, a timer value rewriting portion rewriting the second timer value as a value acquired by subtracting a difference written on the timer value writing portion from the second timer value at the reception time.

4. The wireless communication system of claim 1, wherein the set value is set to guarantee desired synchronization communication between the first wireless device and the plurality of second wireless devices.

5. The wireless communication system of claim 4, wherein the set value is a value acquired by adding a given margin to a shortest time determined based on a design value and an actual value.

6. The wireless communication system of claim 5, wherein the set value is obtained by statistical processing based on the actual value.

7. The wireless communication system of claim 6, wherein the set value is a mean value or a center value obtained by the statistical processing for the actual value.

8. The wireless communication system of claim 1, wherein the first device and the second device are control devices that control a control target, and the first device is a higher control device and the plurality of second devices are lower control devices that control the control target, and the control target is connected to the plurality of second devices, a control signal as the periodic data is transmitted from the first device to the plurality of second devices, and the control target connected to the plurality of second devices is controlled.

9. A wireless communication method for transmitting periodic data from a first device to a plurality of second devices by wireless communication, comprising:

a process of preparing a wireless communication system including a first wireless device connected to the first device and a plurality of second wireless devices connected to the plurality of second devices, respectively; and a process of synchronizing the first wireless device and the plurality of second wireless devices when a time until the first wireless device receives a response from a second wireless device after the first wireless device has transmitted the periodic data is equal to or less than a set value.

10. The wireless communication method of claim 9, wherein the process of synchronizing the first wireless device and the plurality of second wireless devices includes:

creating a first data acquired by including a first timer value to the periodic data, and measuring a response time until the first wireless device receives the response from a second wireless device after the first wireless device has transmitted the data;

determining whether the response time is equal to or less than the set value, and transmitting a flag to the second wireless device jointly with a second data when the response time is equal to or less than the set value;

writing a difference between the first timer value and a second timer value when the second wireless devices receives the first data acquired by including the first timer value transmitted from the first wireless device; and rewriting the second timer value based on the difference between the first timer value and the second timer value, and establishing a synchronization relationship between the first wireless device and the plurality of second wireless devices when the plurality of second wireless devices receives the second data attached with the flag from the first wireless device.

11. The wireless communication method of claim 10, wherein in the establishing of the synchronization relationship between the first wireless device and the plurality of second wireless devices, the second wireless device rewrites, when receiving the data attached with the flag, the second timer value with a value acquired by subtracting the difference from the second timer value at the reception time.

12. The wireless communication method of claim 9, wherein the set value is set to guarantee desired synchronization communication between the first wireless device and the plurality of second wireless devices.

13. The wireless communication method of claim 12, wherein the set value is a value acquired by adding a given margin to a shortest time determined based on a design value and an actual value.

14. The wireless communication method of claim 13, wherein the set value is obtained by statistical processing based on the actual value.

15. The wireless communication method of claim 14, wherein the set value is a mean value or a center value obtained by the statistical processing for the actual value.

16. The wireless communication method of claim 9, wherein the first device and the second device are control devices that control a control target, and the first device is a higher control device and the plurality of second devices are lower control devices that control the control target, and the control target is connected to the plurality of second devices, a control signal as the periodic data is transmitted from the first device to the plurality of second devices, and the control target connected to the plurality of second devices is controlled.

17. A control device for controlling a substrate processing apparatus processing a substrate, comprising:
a higher control unit;
a plurality of lower control units to which periodic control data is transmitted from the higher control unit; and
a wireless communication system transmitting the periodic control data by wireless communication from the higher control unit to the plurality of lower control units,
wherein the wireless communication system includes:
a first wireless device connected to the higher control unit; and
a plurality of second wireless devices connected to the plurality of lower control units, respectively;
the first wireless device includes a first wireless portion performing the wireless communication and a first control portion controlling the first wireless portion; and
the second wireless device includes a second wireless portion performing the wireless communication and a second control portion controlling the second wireless portion, and
the first control portion and the second control portion synchronize the first wireless device and the plurality of second wireless devices when a time until the first wireless device receives a response from a second wireless device after the first wireless device has transmitted the periodic data from the higher control unit is equal to or less than a set value.

18. The control device of claim 17, wherein the substrate processing apparatus processes the substrate by using a plurality of end devices, the plurality of end devices are connected to the plurality of lower control units, respectively, the periodic control data from the higher control unit is transmitted from the higher control unit to the plurality of lower control units through the wireless communication system, and the plurality of end devices are controlled.

19. The control device of claim 18, wherein the lower control unit is an input/output (I/O) board performing an input/output control of the periodic control data, and digital output update, digital input update request data, and analog input update request data as the periodic control data are transmitted from the higher control unit.

20. The control device of claim 17, wherein the substrate processing apparatus performs atomic layer deposition (ALD) film forming for the substrate.

21. A control method for controlling, by a control device, a substrate processing apparatus processing a substrate, the control device including a higher control unit and a plurality of lower control units to which periodic control data is transmitted from the higher control unit, comprising:
a process of preparing a wireless communication system including a first wireless device connected to the higher control unit and a plurality of second wireless devices connected to the plurality of lower control units, respectively;
a process of synchronizing the first wireless device and the plurality of second wireless devices when a time until the first wireless device receives a response from a second wireless device after the first wireless device has transmitted the periodic control data from the higher control unit is equal to or less than a set value; and
a process of controlling the substrate processing apparatus by transmitting the periodic control data from the higher control unit to the lower control unit via the wireless communication system.

22. The control method of claim 21, wherein the substrate processing apparatus processes a substrate by using a plurality of end devices, and the plurality of end devices are connected to the plurality of lower control units, respectively, and
the process of controlling the substrate processing apparatus controls the plurality of end devices by the periodic control data transmitted from the higher control unit to the lower control unit.

23. The control method of claim 22, wherein the lower control unit is an input/output (I/O) board performing an input/output control of the periodic control data, and digital output update, digital input update request data, and analog input update request data as the periodic control data are transmitted from the higher control unit.

24. The control method of claim 21, wherein the substrate processing apparatus performs atomic layer deposition (ALD) film forming for the substrate.

* * * * *